(12) United States Patent
Lin et al.

(10) Patent No.: US 8,754,438 B2
(45) Date of Patent: Jun. 17, 2014

(54) LIGHT EMITTING DIODE

(75) Inventors: Ya-Wen Lin, Hsinchu (TW);
Shih-Cheng Huang, Hsinchu (TW);
Po-Min Tu, Hsinchu (TW); Chia-Hung Huang, Hsinchu (TW); Shun-Kuei Yang, Hsinchu (TW)

(73) Assignee: Advanced Optoelectronics Technology, Inc., Hsinchu Hsien (TW)

(*) Notice: Subject to any disclaimer, the term of this patent is extended or adjusted under 35 U.S.C. 154(b) by 130 days.

(21) Appl. No.: 13/400,097

(22) Filed: Feb. 19, 2012

(65) Prior Publication Data
US 2013/0001508 A1 Jan. 3, 2013

(30) Foreign Application Priority Data
Jun. 30, 2011 (CN) .......................... 2011 1 0181775

(51) Int. Cl.
*H01L 33/62* (2010.01)

(52) U.S. Cl.
USPC 257/99; 257/79; 257/E33.001; 257/E33.005; 257/E33.006; 257/E33.011

(58) Field of Classification Search
USPC ................ 257/13, 79, 99, E33.001, E33.005, 257/E33.006, E33.011
See application file for complete search history.

(56) References Cited

U.S. PATENT DOCUMENTS

| | | | |
|---|---|---|---|
| 2005/0194634 A1* | 9/2005 | Ishikawa et al. | 257/324 |
| 2007/0246719 A1* | 10/2007 | Odawara et al. | 257/94 |

* cited by examiner

*Primary Examiner* — Minchul Yang
(74) *Attorney, Agent, or Firm* — Novak Druce Connolly Bove + Quigg LLP

(57) ABSTRACT

An LED comprises a substrate, a buffer layer, an epitaxial layer and a conductive layer. The epitaxial layer comprises a first N-type epitaxial layer, a second N-type epitaxial layer, and a blocking layer with patterned grooves sandwiched between the first and second N-type epitaxial layers. The first and second N-type epitaxial layers make contact each other via the patterned grooves. Therefore, the LED enjoys a uniform current distribution and a larger light emitting area. A manufacturing method for the LED is also provided.

7 Claims, 5 Drawing Sheets

– 1 –
LIGHT EMITTING DIODE

1. TECHNICAL FIELD

The disclosure relates generally to a light emitting diode (LED), and more particularly to an LED with an epitaxial structure having an enhanced light emitting efficiency.

2. DESCRIPTION OF THE RELATED ART

Light emitting diodes (LEDs) have low power consumption, high efficiency, quick reaction time, long life and an absence of toxic elements in the manufacture thereof. During operations, a current is inducted into an LED from an anode to a cathode located on the opposite side, wherein the current may be collected in a certain region which results in an elevated temperature. However, a raised temperature leads to both efficiency and the working life of the LED being reduced. To prevent the aforesaid issues, a length of the anode or the cathode, or both may be stretched to increase an area of the anode or the cathode or both, whereby the conducted current can be spread over a large area to prevent the LED from having a overheating at a localized portion thereof. However, this may decrease a light emitting area of the LED since a portion of the epitaxial layer and the light emitting area are etched to accommodate the stretched cathode or the stretched anode. Hence, a new design of LED having a uniform current distribution and a large light emitting area is required.

DETAILED DESCRIPTION

Exemplary embodiments of the disclosure will be described with reference to the accompanying drawings.

Figure 1:
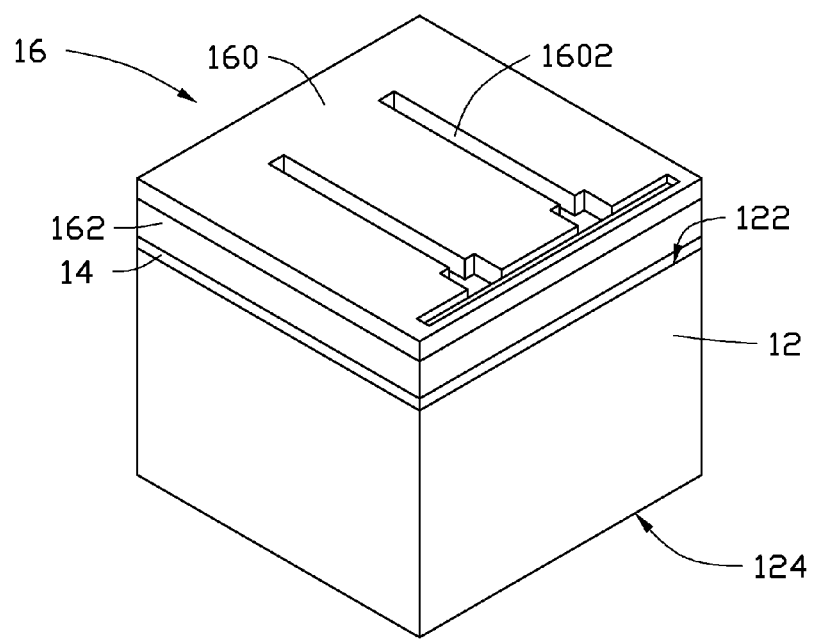
FIG. 1 is a schematic diagram of a blocking layer with patterned grooves of an LED of the disclosure.
Figure 2:
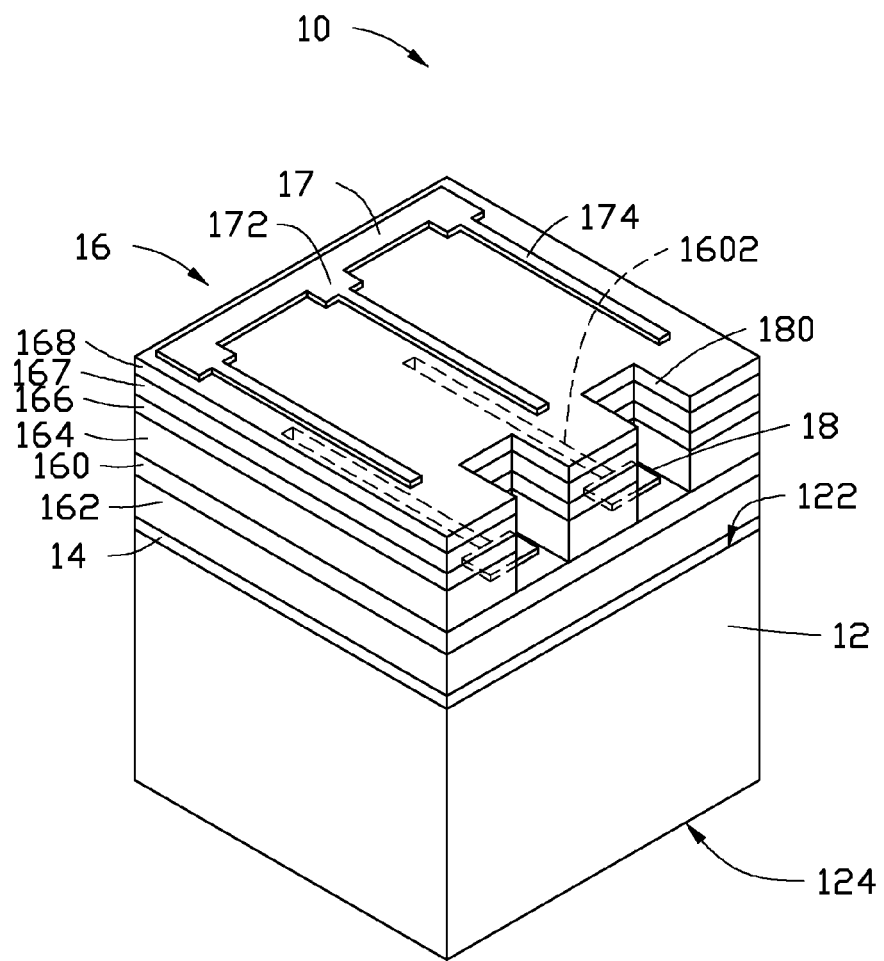
FIG. 2 is a schematic diagram of the LED of the disclosure.

Referring to FIG. 1 and FIG. 2, the disclosure provides an LED 10, which comprises a substrate 12, a buffer layer 14 and an epitaxial layer 16. The substrate 12 comprises a top face 122 and a bottom face 124 opposite to each other. The buffer layer 14 is located on the top face 122, and the epitaxial layer 16 is disposed on the buffer layer 14. In this embodiment, the substrate 12 is made of sapphire.

The epitaxial layer 16 comprises a first N-type epitaxial layer 162, a second N-type epitaxial layer 164 and a blocking layer 160 sandwiched between the layers 162 and 164. The blocking layer 160 has patterned grooves 1602 penetrating completely through the blocking layer 160 from one surface to the other, whereby the first N-type epitaxial layer 162 can make contact with the second N-type epitaxial layer 164 via the patterned grooves 1602. The second N-type epitaxial layer 164 has a portion extending into the patterned grooves 1602 to engage with the first N-type epitaxial layer 162. Moreover, a light emitting layer 166, a P-type epitaxial layer 167 and a conductive layer 168 are disposed in that sequence on the second N-type epitaxial layer 164.

A P-type electrode 17 and an N-type electrode 18 are formed on the epitaxial layer 16. The P-type electrode 17 is located on the conductive layer 168, wherein the P-type electrode 17 further comprises a bonding portion 172 disposed on one end of the conductive layer 168 and an extending portion 174 with a patterned structure. The patterned structure of the extending portion 174 on the conductive layer 168 is staggered with the patterned grooves 1602 inside the epitaxial layer 16, as shown in FIG. 2. In this embodiment, the N-type electrode 18 and the P-type electrode 17 are generally located on the two opposite sides of the epitaxial layer 16 of the LED 10, wherein the N-type electrode 18 is disposed on the blocking layer 160 and makes contact with the first N-type epitaxial layer 162 via the patterned grooves 1602; the N-type electrode 18 is separated from the second N-type epitaxial layer 164 and has a portion extending into the patterned grooves 1602 to engage with the first N-type epitaxial layer 162. Alternatively, the N-type electrode 18 also can be directly disposed on the first N-type epitaxial layer 162.

Figure 3:
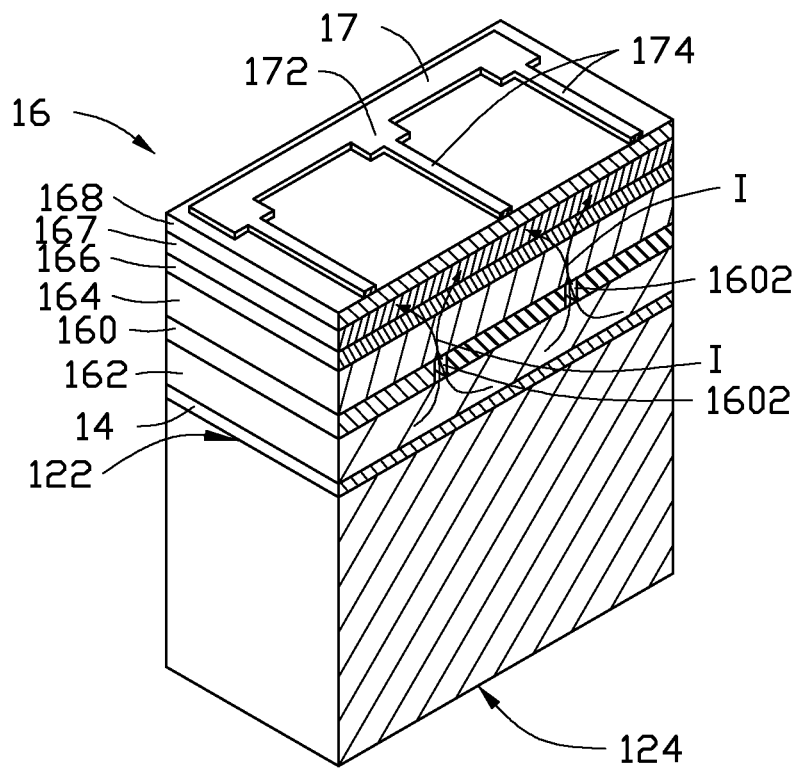
FIG. 3 is a cross section of the LED of FIG. 2.

The blocking layer 160 is material with a high electrical resistance and is sandwiched between the first and the second N-type epitaxial layers 162, 164, and is regarded as an electron blocking layer having the patterned grooves 1602. In one embodiment, a current I is fed into the LED 10 from the P-type electrode 17 through the conductive layer 168 and the second N-type epitaxial layer 164 to the first N-type epitaxial layer 162, whereby the patterned grooves 1602 of the blocking layer 160 are able to uniformly allot the current I in the first N-type epitaxial layer 162, as shown in FIG. 3. Moreover, by virtue of the extending portion 174 of the P-type electrode 17, the current I can be more uniformly conducted onto the conductive layer 168. Accordingly, both the light emitting efficiency and the area from which light can be emitted of the LED 10 is enhanced due to the current I flowing through the light emitting layer 166 more uniformly.

Figure 4:
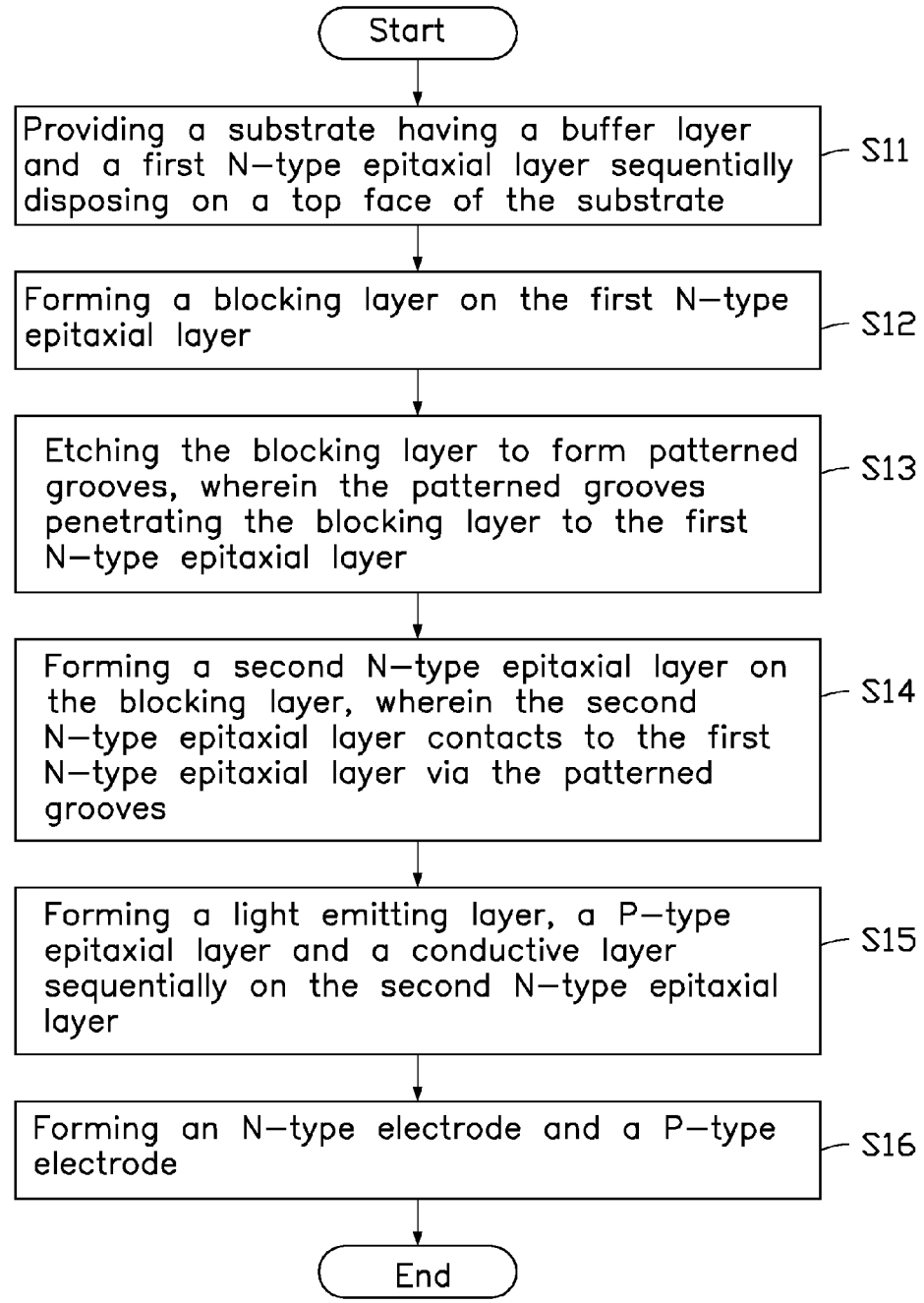
FIG. 4 is a flow chart of the manufacturing method for the LED.
Figure 5:
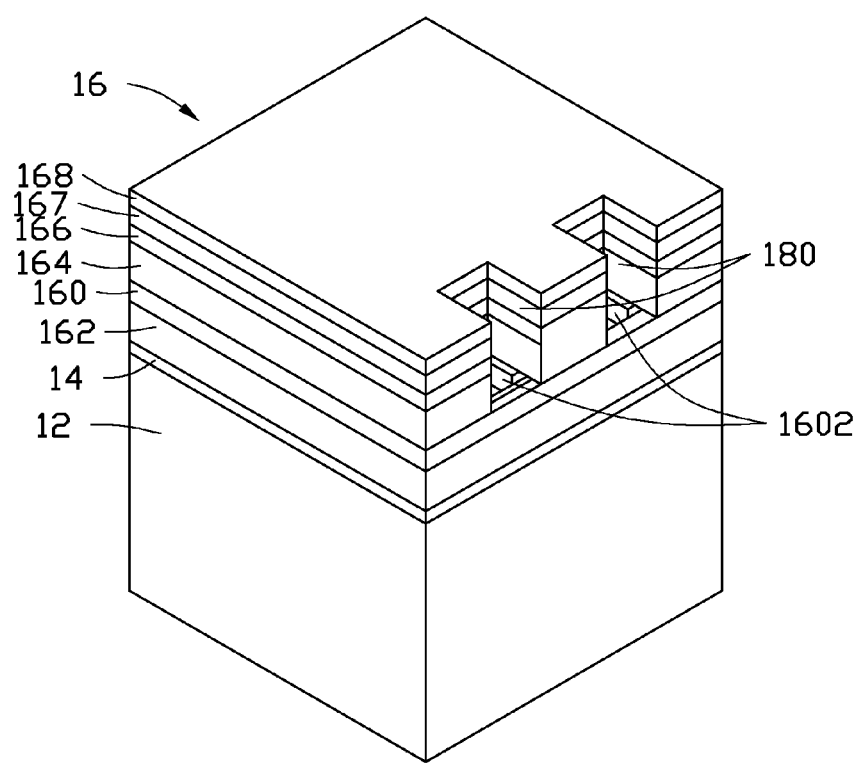
FIG. 5 is a schematic diagram showing a step of forming a vacant area which penetrates through an epitaxial layer of the LED according to the method of FIG. 4.

Referring to FIG. 4 and FIG. 5, the disclosure also provides a manufacturing method for the LED 10, which comprises the following steps:

In step S11, a substrate 12 having a buffer layer 14 and a first N-type epitaxial layer 162 sequentially disposed on a top face of the substrate 12 is provided. In one embodiment, the substrate 12 is made of sapphire, the buffer layer 14 is made of a III-group nitride compound semiconducting material, and the first N-type epitaxial layer 162 is a III-group nitride compound semiconducting material as a contacting layer.

In step S12, a blocking layer 160 is formed on the first N-type epitaxial layer 162. Alternatively, the blocking layer 160 can be low-doped or left undoped as a III-group nitride compound layer for the blocking of electrons.

In step S13, the blocking layer 160 is etched to form patterned grooves 1602 penetrating completely through the blocking layer 160 to the first N-type epitaxial layer 162. As shown in FIG. 1, the first N-type epitaxial layer 162 is exposed through the blocking layer 160 via the patterned grooves 1602.

In step S14, a second N-type epitaxial layer 164 is formed on the blocking layer 160, wherein the second N-type epitaxial layer 164 makes contact with the first N-type epitaxial layer 162 via the patterned grooves 1602. The second N-type epitaxial layer 164 has a portion extending into the patterned grooves 1602 to engage with the first N-type epitaxial layer 162. In this embodiment, the second N-type epitaxial layer 164 is made of a III-group nitride compound semiconducting material as a contacting layer.

In step S15, a light emitting layer 166, a P-type epitaxial layer 167 and a conductive layer 168 are sequentially formed on the second N-type epitaxial layer 164. In this embodiment, the light emitting layer 166 is the layer actually active in generating light, wherein the area of the light emitting layer 166 equates to the light emitting area of the LED 10. The P-type epitaxial layer 167 is a contacting layer of a III-group nitride compound semiconducting material. Although conductive, the conductive layer 168 can be transparent so as not to impede the light emitting efficiency of the LED 10.

In step S16, an N-type electrode 18 and a P-type electrode 17 are formed. The P-type electrode is formed on the conductive layer 168. In one embodiment, as shown in FIG. 5, a depression 180 which penetrates through the second N-type epitaxial layer 164, the blocking layer 160, the light emitting layer 166 and the P-type epitaxial layer 167, is formed by etching. Thereafter, the N-type electrode 18 is disposed on the first N-type epitaxial layer 162 via the patterned grooves 1602 inside the depression 180. The depression 180 may occupy an area the same as or slightly larger than that the N-type electrode 18 occupies such that the light emitting layer 166 of the LED 10 would not be removed excessively. Alternatively, the N-type electrode 18 also can be disposed on the blocking layer 160 and electrically contact with the first N-type epitaxial layer 162 via the patterned grooves 1602. Moreover, the P-type electrode 17 comprises a bonding portion 172 and an extending portion 174. The bonding portion 172 is disposed so as to pass a working current into the LED 10 from the outside, and the extending portion 174 is located on the conductive layer 168 for increasing the current flowing area.

The embodiment provides the LED 10 containing the blocking layer 160 with patterned grooves 1602, sandwiched between the first and second N-type epitaxial layers 162 and 164. Moreover, the extending portion 174 of the P-type electrode 17 is disposed on the conductive layer 168 so as to be misaligned or staggered with the patterned grooves 1602 inside the epitaxial layer 16. Therefore, the conducted current can evenly flow through the epitaxial layer 16 to prevent a single current hotspot and the generation of unwanted heat. Further, since the LED 10 has a large light emitting area, both the light emitting efficiency and the intensity of the LED 10 are enhanced.

It is to be understood, however, that even though numerous characteristics and advantages of the disclosure have been set forth in the foregoing description, together with details of the structure and function of the disclosure, the disclosure is illustrative only, and changes may be made in detail, especially in the matters of shape, size, and arrangement of parts within the principles of the disclosure to the full extent indicated by the broad general meaning of the terms in which the appended claims are expressed.

What is claimed is:

1. An LED, comprising:
   a substrate, having a top face and a bottom face;
   a buffer layer, disposed on the top face of the substrate;
   an epitaxial layer, disposed on the buffer layer, comprising:
      a first N-type epitaxial layer and a second N-type epitaxial layer;
      a blocking layer, having patterned grooves, sandwiched between the first and the second N-type epitaxial layers, wherein the first and the second N-type epitaxial layers contacts to each other via a portion of the second N-type epitaxial layer in the patterned grooves;
      a light emitting layer, disposed on the second N-type epitaxial layer; and
      a P-type epitaxial layer, disposed on the light emitting layer;
   a conductive layer, disposed on the P-type epitaxial layer;
   a P-type electrode disposed on the conductive layer; and
   an N-type electrode disposed on the blocking layer opposite to the P-type electrode, wherein the N-type electrode is separated from the second N-type epitaxial layer and has a portion extending into the patterned grooves to contact with the first N-type epitaxial layer.

2. The LED as claimed in claim 1, wherein the P-type electrode comprises a bonding portion located on one end of the conductive layer and an extending portion with a patterned structure.

3. The LED as claimed in claim 2, wherein the patterned structure of the extending portion is staggered with the patterned grooves inside the epitaxial layer.

4. The LED as claimed in claim 1, wherein the substrate is sapphire.

5. An LED, comprising:
   a substrate, having a top face and a bottom face;
   a buffer layer, disposed on the top face of the substrate;
   an epitaxial layer, disposed on the buffer layer, comprising a first N-type epitaxial layer and a second N-type epitaxial layer, a blocking layer with patterned grooves and sandwiched between the first and the second N-type epitaxial layers, a light emitting layer disposed on the second N-type epitaxial layer and a P-type epitaxial layer disposed on the light emitting layer;
   an N-type electrode, contacting to the first N-type epitaxial layer;
   a conductive layer, disposed on the P-type epitaxial layer; and
   a P-type electrode, disposed on the conductive layer;
   wherein the first and the second N-type epitaxial layers contact to each other via the patterned grooves, and the N-type electrode is disposed inside the patterned grooves of the blocking layer to contact with the first N-type epitaxial layer.

6. The LED as claimed in claim 5, wherein the P-type electrode comprises a bonding portion located on one end of the conductive layer and an extending portion with a patterned structure.

7. The LED as claimed in claim 6, wherein the patterned structure of the extending portion is staggered with the patterned grooves inside the epitaxial layer.

* * * * *